United States Patent
Lee

(10) Patent No.: US 10,797,788 B1
(45) Date of Patent: Oct. 6, 2020

(54) REDUCING POWER CONSUMPTION IN A RECEIVER OF A COMMUNICATIONS DEVICE

(71) Applicant: Amazon Technologies, Inc., Seattle, WA (US)

(72) Inventor: Jung Joo Lee, Sunnyvale, CA (US)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 16/700,371

(22) Filed: Dec. 2, 2019

(51) Int. Cl.
*H04B 7/185* (2006.01)
*H03G 3/00* (2006.01)
*H03G 3/30* (2006.01)

(52) U.S. Cl.
CPC ........ *H04B 7/18543* (2013.01); *H03G 3/001* (2013.01); *H03G 3/3068* (2013.01); *H03G 3/3078* (2013.01); *H04B 7/18523* (2013.01)

(58) Field of Classification Search
None
See application file for complete search history.

(56) References Cited

U.S. PATENT DOCUMENTS

| | | | | |
|---|---|---|---|---|
| 5,553,081 A * | 9/1996 | Downey | .................. | H04B 3/54 329/304 |
| 5,612,975 A * | 3/1997 | Becker | .................. | H04L 7/0029 329/308 |
| 7,133,644 B2 * | 11/2006 | Demir | .................. | H04B 1/0475 455/67.11 |
| 8,175,549 B2 * | 5/2012 | Faust | .................. | H04B 17/21 455/114.2 |
| 9,571,205 B1 * | 2/2017 | Suarez | .................. | H04B 1/525 |
| 2005/0070239 A1 * | 3/2005 | Paulus | .................. | H04B 1/0007 455/205 |
| 2005/0227640 A1 * | 10/2005 | Haque | .................. | H03F 1/0261 455/126 |
| 2006/0199558 A1 * | 9/2006 | Chiodini | .................. | H04B 1/7075 455/234.1 |
| 2009/0004981 A1 * | 1/2009 | Eliezer | .................. | H03F 1/3282 455/127.1 |
| 2009/0310690 A1 * | 12/2009 | Lee | .................. | H03G 3/3078 375/260 |
| 2010/0098195 A1 * | 4/2010 | Nekhamkin | .................. | H04L 27/0014 375/344 |
| 2010/0171659 A1 * | 7/2010 | Waters | .................. | H04B 17/24 342/357.74 |

(Continued)

*Primary Examiner* — Lana N Le
(74) *Attorney, Agent, or Firm* — Kilpatrick Townsend & Stockton, LLP

(57) ABSTRACT

Techniques for improving the power consumption of a communications device are described. In an example, the communications device generates a first digital signal based at least in part on an analog signal. The communications device also determines a second digital signal that corresponds to a predefined direct current (DC) signal. Further, the communications device generates a third digital signal based at least in part on the first digital signal and the second digital signal and compares a power estimate of the third digital signal with a power threshold. The power threshold is defined based at least in part on the predefined DC signal. The communications device determines that the analog signal corresponds to a data packet based at least in part on an outcome of the comparing.

20 Claims, 11 Drawing Sheets

(56) References Cited

U.S. PATENT DOCUMENTS

| | | | |
|---|---|---|---|
| 2012/0252394 A1* | 10/2012 | Balakrishnan | H04B 1/405 455/313 |
| 2014/0113561 A1* | 4/2014 | Maguire | H02J 50/20 455/41.2 |
| 2016/0173172 A1* | 6/2016 | Greene | H04B 7/0802 455/562.1 |
| 2019/0132154 A1* | 5/2019 | Gurevitz | H04W 52/288 |

* cited by examiner

700

| DC Signal Voltage | Digital Signal | DC Signal Power | Gain Index |
|---|---|---|---|
| 25 mV | 1010_0000_0000 | 12.5 mW | 1 |
| 35 mV | 0000_0101_0000 | 17.5 mW | 2 |
| 50 mV | 0000_0000_0110 | 25 mW | 3 |

REDUCING POWER CONSUMPTION IN A RECEIVER OF A COMMUNICATIONS DEVICE

BACKGROUND

Satellites can be launched into orbit to provide various functionalities. For example, a communications satellite can create a communications channel between a source device and a destination device at different locations on Earth and can relay and amplify radio telecommunications signals exchanged between the two devices via a transponder of the communications satellite. Of course, other types of satellites can be launched and used, including weather satellite, imaging satellites, and the like. Although their primary design is not for creating communications channels between devices, these satellites may nonetheless receive radio telecommunication signals from ground stations on Earth.

BRIEF DESCRIPTION OF THE DRAWINGS

Various embodiments in accordance with the present disclosure will be described with reference to the drawings, in which:

FIG. 7 illustrates an example of a predefined DC look-up table usable in an idle mode, according to embodiments of the present disclosure;

DETAILED DESCRIPTION

Figure 1:
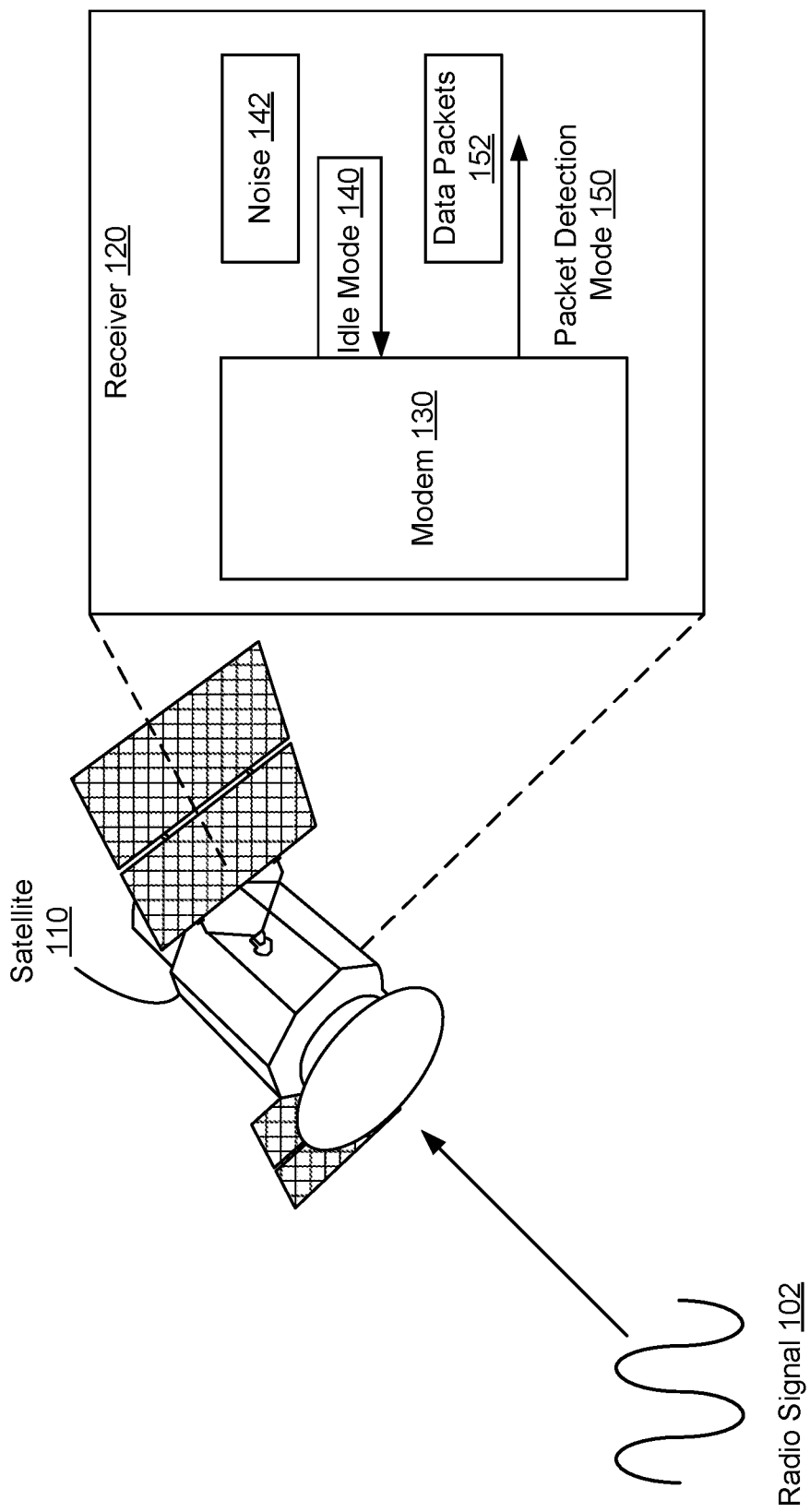
FIG. 1 illustrates an example of signal processing by a receiver of a satellite, according to embodiments of the present disclosure.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments of the present disclosure are directed to, among other things, improving the power consumption of a communications device. In an example, the communications device operates in at least an idle mode and a packet detection. While in the idle mode, the communication device receives an analog signal and determines whether the analog signal corresponds to a data packet or to noise. If corresponding to a data packet, the communications devices switches to the packet detection mode to detect the data packet from the received signal. Otherwise, the communications device remains in the idle mode. Because a relatively smaller amount of power is consumed in the idle mode, the overall power consumption of the communications device is improved by staying in the idle mode until a data packet is presented in the received analog signal. Nonetheless, further improvements to the power consumption in the idle mode can be possible.

In particular, dynamic power is consumed in the idle mode because of transistor charging and discharging in the communications device. More specifically, the determination of whether a data packet or noise is present in a received analog signal is performed in the digital domain by converting the received analog signal into a digital signal and processing the digital signal. In the digital domain, the noise can be represented as a set of bits and transistors of the communications devices are charged or discharged to represent the bits. Given the fluctuating nature of the noise over time, the values of the bits can change between positive and negative digital representations (e.g., a number of the bits changes between zeros and ones, and vice versa) resulting in the charging and discharging of the transistors and, thus, unnecessary dynamic power consumption to process a noise signal.

To reduce the dynamic power consumption in the idle mode, and thus, further improve the overall power consumption of the communications device, embodiments of the present disclosure involve adding a direct current (DC) signal such that the values of the bits no longer fluctuate or the number of fluctuating bits is significantly reduced. For instance, the DC signal is added, in the digital domain, to the digital signal of the received analog signal, thereby generating an updated digital signal. An estimate of the power of the updated digital signal is compared to a power threshold, where this power threshold is adjusted to account for the DC signal. If the estimate is greater than the power threshold, the communications device switches to the packet detection mode. Otherwise, the communications device stays in the idle mode. While in the packet detection mode, the noise is no longer a predominant factor and, thus, the addition of a DC signal is no longer necessary and need no longer be performed. In this way, the dynamic power consumption is reduced in the idle mode because the fluctuation of the noise's digital representation is reduced or eliminated. And as soon as a data packet is present and the noise is no longer a predominant factor, the addition of the DC signal is halted.

To illustrate, consider an example of a satellite receiver that includes a modem operable in an idle mode and a packet detection mode. While in the idle mode, the modem generates a first digital signal by converting an analog signal and adds thereto a digital signal representing a DC signal to generate an updated digital signal. The DC signal has a predefined amount of power. The modem also updates a power threshold to include the predefined amount of power. The modem estimates the amount of power of the updated digital signal and compares this estimate to the updated power threshold. Upon determining that the estimate is greater than the updated power threshold, the modem switches to a packet detection mode and detects a data packet corresponding to the analog signal. Thereafter, and while still being in the packet detection mode, the modem receives and converts a second analog signal to a second digital signal. However, no DC signal is added thereto and the power threshold is not updated to include the predefined amount of power. The modem also estimates and compares the amount of power of the second digital signal to the power threshold. If greater than the power threshold, a second data packet is detected. Otherwise, the modem switches back to the idle mode.

In the interest of clarity of explanation, various embodiments of the present disclosure are described in connection with a receiver of a satellite (e.g., an artificial satellite that can be launched into space). However, the embodiments are not limited as such. In particular, the embodiments generally apply to a communications device that includes at least a receiver. The communications device can act as a relay for data communications between multiple devices, can be merely a receiver of data communications from one or more devices, and/or can be a communications end point of data communications with one or more devices. Further data communications can be performed over one or more types of communications channels, including wireless communications channels such as one relying on radio waves within a particular set of frequency ranges. For instance, the communications device can be a mobile phone, a tablet, a laptop, an Internet of Things (IoT) device, a base station, a ground station, or any receiver of a communications system. Generally, a receiver of the communications device includes a modem that demodulates signals to decode received information. Such a modem can operate in an idle mode, where a predefined DC signal is added in the digital domain to reduce the fluctuation of the digital representation of noise.

FIG. 1 illustrates an example of signal processing by a receiver 120 of a satellite 110, according to embodiments of the present disclosure. The receiver 120 may be a radio frequency receiver of a communications system of the satellite 110, where this communications system is configured to relay radio signals received by the receiver 120 from a source (e.g., a ground station) to a destination (e.g., another ground station). As illustrated, the receiver 120 receives and processes a radio signal 102 to determine whether the radio signal 102 modulates data (e.g., information bits sent from a source) or is merely a noisy radio signal (e.g., modulates channel noise but not information bits sent from a source). In an example, the receiver 120 (e.g., a modem 130 thereof) is in an idle mode 140. Upon detecting that data is being received, the receiver 120 switches to a packet detection mode 150. Otherwise, the receiver 120 determines that noise is being received and remains in the idle mode 140.

In an example, the satellite 110 is a communications satellite deployed in a particular orbit. The satellite 110 can be part of a constellation of communications satellites distributed between one more orbits and/or at one or more altitudes within an orbit, such as in a low Earth orbit (LEO) and/or in a medium Earth orbit (MEO). Alternatively, the satellite 110 can be a communications satellite in a geostationary orbit (GEO). In both cases, the satellite 110 can provide Internet access to user equipment on Earth. For instance, the satellite 110 relays radio signals in particular radio frequency (RF) spectrums (e.g., L band, $K_u$ band, $K_a$ band, V band, or other RF bands) from one place on Earth to another by, for instance, receiving the radio signals from user equipment on Earth or from another communications satellite, amplifying the radio signals, and sending the amplified radio signals to another user equipment on Earth or to another communications satellite. The radio signals can carry Internet data, although other types of communications data are also possible, such as telephone data, radio data, broadcast data, and the like.

The radio signal 102 can be a signal carried by a radio wave in a particular RF spectrum (e.g., L band, $K_u$ band, $K_a$ Band, V band, or other RF bands) and that modulates communications data, such as Internet data and/or another type of communications data. The communications data is generally a stream of digital data (e.g., bits) modulated according to a modulation method and sent from user equipment or another satellite as the radio signal 102.

The receiver 120 can be a component of a transponder or a communications system of the satellite 110 and supports uplink operations, where the uplink operations may involve other components such as a set of amplifiers and/or transmitters. The receiver 120 includes a set of antennas, frequency converters, and a modem, among other components. In particular, the receiver 120 receives the radio signal 102 and down-converts the radio signal 102 into a particular intermediate frequency (IF) input. The IF input can be an analog signal in a particular frequency band (e.g., fifty to two-hundred MHz). Upon detecting that the IF input modulates communication data, the modem demodulates the IF input to output data packets.

In an example, the satellite 110 includes multiple receivers. For instance, the satellite 110 can include a phased array having thousands or more of receivers, including the receiver 120. To reduce power consumption, the receiver 120 is operable in at least the idle mode 140 and the packet detection mode 150. In particular, the radio signal 102 can be sent intermittently at various points in time (e.g., non-continuously). At times when the radio signal 102 is not sent, the receiver 120 can nonetheless receive noise (e.g., a signal that does not modulate communications data). To avoid the need to demodulate noise, the receiver (120) can detect whether it is receiving noise or a signal carrying communications data, switch out of the idle mode 140 and to the packet detection mode 150 when the latter signal is detected, and switch out of the packet detection mode 150 and to the idle mode 140 when noise is detected.

The idle mode 140 represents a mode of operation of the receiver 120, where the receiver 120 consumes a relatively smaller amount of power than when in the packet detection mode 150. For instance, in the idle mode 140, components of the receiver that detect whether a received signal is noise or carries communications data are powered on while other components that process the received signal to output data packets are powered off. Conversely, the packet detection mode 150 is a mode of operation of the receiver 120, whereby the components of the receiver 120 that process the received signal and output the data packets are powered on.

As illustrated in FIG. 1, the modem 130 of the receiver 120 whether the idle mode 140 or the packet detection mode 150 should be used. In an example, the modem 130 adds a predefined DC signal, referred to herein also as an pre-defined DC signal, to the received signal while operating in the idle mode 140. In comparison, while operating in the packet detection mode 150, no predefined DC signal is added to the received signal.

For instance, the modem 130 is in the idle mode 140. An IF input to the modem 130 corresponds to a received signal. The modem 130 adds the predefined DC signal to the IF input to generate a DC updated signal. The modem 130 detects based on, for instance, an estimate of the amount of power of the DC updated signal, whether the IF input is noise 142 or carries communications data. If the noise 142 is detected, the modem 130 remains in the idle mode 140 (as illustrated in FIG. 1 with the loop back). If communications data is detected, the modem 130 switches to the packet detection mode 150, whereby signal processing components of the modem 130 are powered on to process the IF input (e.g., without adding the predefined DC signal) and output one or more data packets 152 representing the communications data. The signal processing components include, for instance, a demodulator, an error correction decoder, a differential decoder, a descrambler, and/or a de-multiplexer.

Further, while in the packet detection mode 150, the modem 130 detects that the IF input no longer carries communications data and is noise. This detection can be performed based on the amount of power of the IF input. In this case, the modem 130 switches to the idle mode 140 and, hence, re-starts adding an predefined DC signal to the IF input as long as the modem 130 remains in the idle mode 140.

Figure 2:
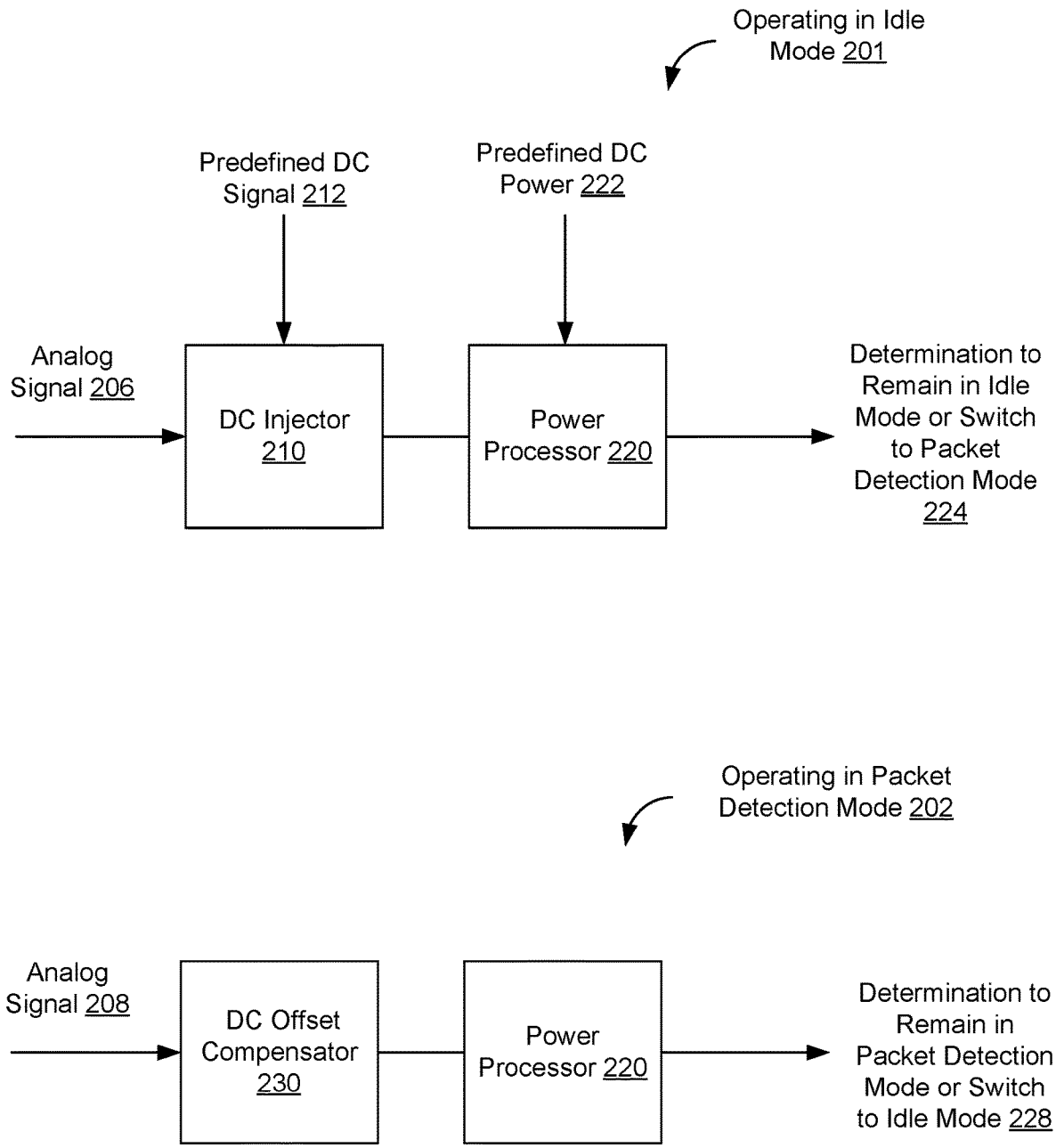
FIG. 2 illustrates an example of transitioning by a receiver between an idle mode and a packet detection mode, according to embodiments of the present disclosure.

FIG. 2 illustrates an example of transitioning by a receiver between an idle mode 201 and a packet detection mode 202, according to embodiments of the present disclosure. The transitioning relies on the use of an predefined DC signal 212 and a predefined DC power 222 that corresponds to an amount of power of the predefined DC signal 212. The receiver can correspond to the receiver 120 of FIG. 1. The idle mode 201 and the packet detection mode 202 can also correspond to the idle mode 140 and the packet detection mode 150, respectively, of FIG. 1.

As illustrated, the receiver includes a DC injector 210, a power processor 220, and a DC offset compensator 230. In an example, the DC injector 210, the power processor 220, and the DC offset compensator 230 are components of a modem of the receiver. Each of the DC injector 210, the power processor 220, and the DC offset compensator 230 can be implemented as specialized hardware that may, but need not, store and execute software (e.g., computer-readable instructions), and/or can be implemented as a set of memories storing software and a set of general purpose processors executing the software. Examples of the DC injector 210, the power processor 220, and the DC offset compensator 230 are further illustrated in FIG. 4.

While in the idle mode 201, the DC injector 210 and the power processor 220 are powered on to detect whether an analog signal 206 (e.g., an IF input to the modem) is noise or carries communications data. If the noise is detected, the receiver remains 224 in the idle mode 201. Otherwise, the output of the power processor 220 indicates that the receiver is to switch 226 to the packet detection mode 202.

While in the packet detection mode 202, the DC offset compensator 230 and the power processor 220 are powered on, while the DC injector 210 may be powered off, to detect whether an analog signal 208 (e.g., an IF input to the modem) is noise or carries communications data. If the detection indicates that the analog signal 208 carries communications data, the receiver remains in the packet detection mode 202, where the analog signal (or its digital representation) is sent for further processing (illustrated as "to data detection 228" in FIG. 2) to output data packets. Otherwise, the output of the power processor 220 indicates that the receiver is to switch 229 to the idle mode 201.

In an example, in the idle mode 201, the DC injector 210 adds the predefined DC signal 212 to the analog signal 206 to generate a DC updated signal. For instance, this addition can be performed in the digital domain, where signals have digital representations of zeros and ones (e.g., binary representations), and where the addition can be performed by using a digital adder). In particular, a digital signal (e.g., a digital representation) of the predefined DC signal 212 is added (e.g., via to a digital is signal (e.g., also a digital representation) of the analog signal 206 to generate a DC updated digital signal. The predefined DC signal and, equivalently, its digital representations are predefined such that the fluctuation of the noise's digital representation is reduced or eliminated.

The power processor 220 determines whether the analog signal 206 is noise or carries communications data based on the amount of power of the DC updated signal. This amount of power corresponds to the amount of power of the analog signal 206 and the amount of power of the predefined DC signal 212. The amount of power of the predefined DC signal 212 is predefined (given that the predefined DC signal 212 is also predefined) and is referred to herein as the predefined DC power 222. Accordingly, the power processor 220 accounts for the predefined DC power 222 in the determination of whether the analog signal 206 is nose or carries communications data. For instance, an estimate of the amount of power of the DC updated signal is compared to a power threshold. In the digital domain, this estimate can be generated from the DC updated digital signal. The power processor 220 adjusts the power threshold by adding the predefined DC power 222 to the power threshold (e.g., to a predefined power value of the power threshold).

In an example, in the packet detection mode 202, the DC offset compensator 230 does not add the predefined DC signal 212 to the analog signal 208 to generate a DC updated signal. Instead, the DC offset compensator 230 can estimate a DC offset signal from the analog signal 208 and removes, in the analog domain and/or in the digital domain, the DC offset signal from the analog signal 208 to generate an updated analog signal.

The power processor 220 determines whether the analog signal 208 is noise or carries communications data based on the amount of power of the updated analog signal. For instance, an estimate of the amount of power of updated analog signal is compared to a power threshold, where the power threshold is set to a predefined value, and where this predefined value is independent of the predefined DC power 222. In the digital domain, this estimate can be generated from a digital representation of the updated analog signal.

Figure 3:
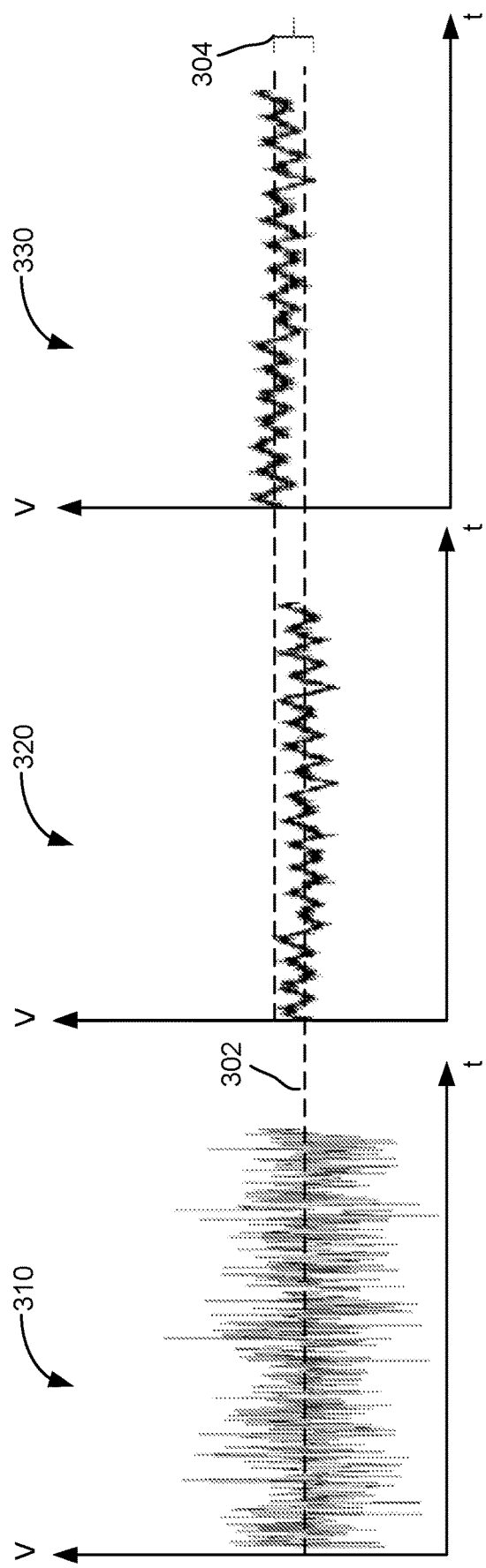
FIG. 3 illustrates an example of adding an predefined direct current signal to a target signal, according to embodiments of the present disclosure.

FIG. 3 illustrates an example of adding an predefined DC signal to a target signal, according to embodiments of the present disclosure. The predefined DC signal and the target signal are examples of the predefined DC signal 212 and the analog signal 206 (or the analog signal 208), respectively, of FIG. 2. Although FIG. 3 illustrates this addition in analog domain, the addition can be performed in the digital domain, whereby a digital representation of the predefined DC signal is added to a digital representation of the target signal.

An analog representation 310 of the target signal is illustrated on the left side of FIG. 3. The analog representation 310 corresponds to the amplitude (e.g., in millivolts) of the target signal over time (e.g., in milliseconds). In an example, the target signal is noise and, thus, its amplitude randomly fluctuates around a base value 302 (e.g., zero volt or a common mode volt).

If no predefined DC signal is added and, instead, a DC offset signal is removed from the target signal (e.g., as in the packet detection mode 202 of FIG. 2) resulting in a compensated signal. The compensated signal has an analog representation 320 illustrated in the middle of FIG. 3. As illustrated with the analog representation 320, the amplitude of the compensated signal also randomly fluctuates around the base value 302.

In comparison, by adding the predefined DC signal to the target signal to generate a DC updated signal, the amplitude of the resulting signal no longer fluctuates or fluctuates around the base value 302 at a much smaller rate relative to the target signal or the compensated signal. An analog representation 330 of the DC updated signal is illustrated on the right side of FIG. 3 to show the smaller fluctuation rate. For instance, assume that the base value 302 is zero volt (or some other value of a common mode volt) and that the noise range of a receiver is fifty millivolts. By predefining the predefined DC signal to have a particular value (e.g., fifty millivolts or some other amplitude around the noise range (e.g., plus or minus ninety percent of the noise range)), the DC updated signal is shifted by the particular value relative to the base value 302 (e.g., plus fifty millivolts when the particular amplitude is predefined as fifty millivolts). This shift is shown with element 304 in FIG. 3.

In the digital domain, each of the signals can be represented as a digital signal having a set of bits. A positive number corresponds to a first set of bits having a first sequence of ones and zeros. A negative number corresponds to a second set of bits having a second sequence of ones and zeros. By fluctuating between the positive and negative numbers, the values of the bits can change frequently (e.g., a zero becomes a one and a one becomes a zero), causing a dynamic power consumption. In comparison, by reducing or eliminating the fluctuation, the values no longer change or such change is less frequent, thereby reducing the dynamic power consumption.

To illustrate, assume that a twelve-bit resolution is used in the digital domain. The digital representation of noise (e.g., of the resulting signal having the analog representation 320) is 0000_0000_0010 for a positive number and 1111_1111_1101 for a negative number. In comparison, when the predefined DC signal is added, the digital representation of noise (e.g., of the DC updated signal having the analog representation 330) is 0000_0000_0100 and 0000_0000_0000. Hence, with the addition of the predefined DC signal, the nine most significant bits do not change when the noise fluctuates between the positive and negative numbers, whereas a much higher number of bits would have changed otherwise.

Figure 4:
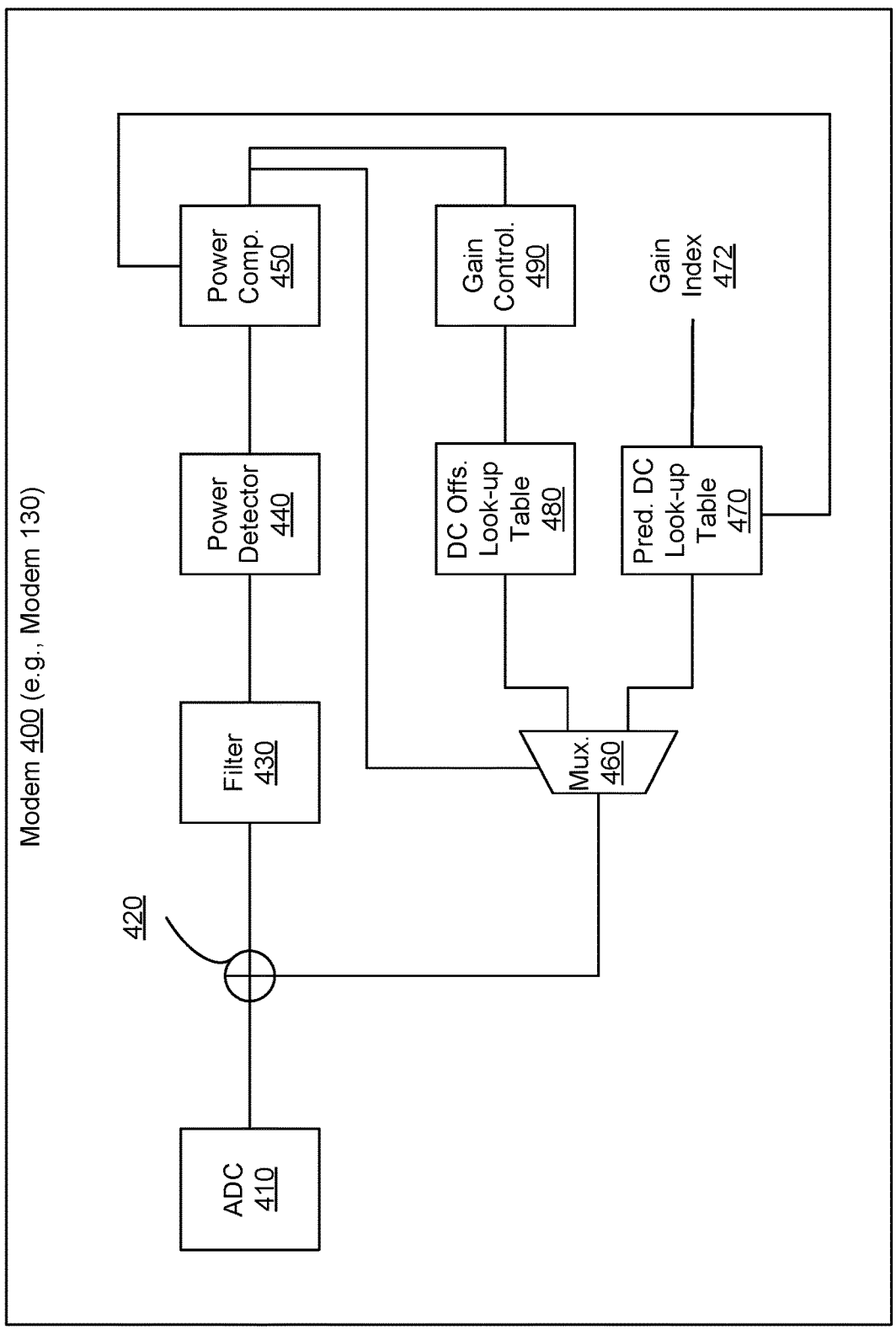
FIG. 4 illustrates an example of components of a modem of a receiver that supports reduced power consumption in an idle mode, according to embodiments of the present disclosure.

FIG. 4 illustrates an example of components of a modem 400 of a receiver that supports reduced power consumption in an idle mode, according to embodiments of the present disclosure. The modem 400 is an example of the modem 130 of FIG. 1. As illustrated, the modem 400 includes and an analog-to-digital converter 410, a combiner 420, a filter 430, a power detector 440, a power comparator 450, a multiplexer 460, an predefined DC look-up table 470, a DC offset look-up table 480, and a gain controller 490.

The analog-to-digital converter 410, the combiner 420, the multiplexer 460, the predefined DC look-up table 470 can be components of the DC injector 210 of FIG. 2. In comparison, the analog-to-digital converter 410, the combiner 420, the multiplexer 460, the DC offset look-up table 480, and/or the gain controller 490 can be components of the DC offset compensator 230 of FIG. 2. The filter 430, the power detector 440, and the power comparator 450 can be components of the power processor 220 of FIG. 2. Each of the analog-to-digital converter 410, the combiner 420, the filter 430, the power detector 440, the power comparator 450, the multiplexer 460, the predefined DC look-up table 470, the DC offset look-up table 480, and the gain controller 490 can be implemented as specialized hardware that may, but need not, store and execute software (e.g., computer-readable instructions), and/or can be implemented as a set of memories storing software and a set of general purpose processors executing the software.

In an example, the analog-to-digital converter 410 receives and converts an analog signal (e.g., an IF inputs) into a first digital signal at a particular bit resolution and a particular sample rate. The analog-to-digital converter 410 can have a particular analog input range (e.g., plus or minus 0.3 volts) and a particular noise range (e.g., plus or minus fifty millivolts). The first digital signal is input to the combiner 420.

In an idle mode, the combiner 420 can add the first digital signal to a second digital signal provided from the multiplexer 460. In a packet detection mode, the combiner 420 may add a digital representation of an estimated DC offset signal from the first digital signal, thereby removing the estimated DC offset signal that is already present analog signal (e.g., the first digital signal already includes the digital representation (e.g., prior to the combiner 420) and, thus, adding the digital representation to the first digital signal effectively removes the digital representation). The addition can be a binary addition. The output of the combiner is a third digital signal that is input to the filter 430.

The filter 430 can remove or reduce noise injected during the analog-to-digital conversion process. This noise can be input noise outside of a signal bandwidth, power supply noise, reference noise, noise feed through a digital interface, analog-to-digital chip thermal noise, and/or or quantization noise. The output of the filter 430 is input to the power detector 440.

The power detector 440 estimates the power of the third digital signal (or, more specifically, of the output of the filter 430). For instance, the estimate is based on demodulating multiple samples of the third digital signal, calculating root means square of the sum of squared components, and averaging over the multiple samples. The estimate can also include an amplitude (e.g., a voltage estimate) of the third digital signal. The estimate is input to the power comparator 450.

The power comparator 450 compares the estimate to a power threshold. The power threshold can be adjusted to account for the predefined DC signal in the idle mode. For instance, when the estimate includes the voltage estimate, the power threshold is set based on a voltage value (e.g., two-hundred millivolts) and this voltage value is adjusted based on the amplitude of the predefined DC signal (e.g., increased from 200 millivolts to two-hundred and fifty millivolts when the amplitude of the predefined DC signal is fifty millivolts). The output of the power comparator 450 includes an indication of whether the estimate exceeds the power threshold or not. This output can be set a binary bit and is input to the multiplexer 460 and to the gain controller 490.

The multiplexer 460 receives the output of the power comparator 450 as a input selector to switch between two input lines. A first input line corresponds to an output of the DC look-up table 470. A second input lines corresponds to the DC offset look-up table 480. In particular, when the input selector indicates that the estimate exceeds the power threshold, the first input line is selected. In this case, the multiplexer 460 outputs the second digital signal to the combiner 420, where this second digital signal corresponds to a digital representation of the predefined DC signal. In comparison, when the input selector indicates that the estimate does not exceed the power threshold, the second input line is selected.

In this case, the multiplexer 460 outputs the second digital signal to the combiner 420, where this second digital signal corresponds to a digital representation of the DC offset signal.

The predefined DC look-up table 470 associates predefined values of the predefined DC signal, with predefined digital representations, and gains. The gains can be used for signal amplification within and/or to output signals from the modem 400. Each of the value can correspond to an amount of predefined DC power and can be defined as, for instance, an amplitude (e.g., a millivolts value). For instance, the predefined DC look-up table 470 indicates that a fifty millivolts predefined DC signal has a first digital representation and is to be used with a first gain, whereas a forty millivolts predefined DC signal has a second digital representation and is to be used with a second gain. A gain index 472 can be input to the predefined DC look-up table. The gain index 472 indicates the gain, such as the ratio of the output signal power to the input signal power. The gain can depend on the design configuration and/or the operational conditions (including temperature) of the modem 400 and the gain index 472 can be an output of a processor or telemetry circuit of the modem 400 monitoring the operational conditions.

The DC offset look-up table 480 can be similar to the predefined DC look-up table 470 but applies to the estimated DC offset signal. In particular, DC offset look-up table 480 associates predefined values of the estimated DC offset signal, with predefined digital representations, and gains. The DC offset look-up table 480 may, but need not, indicate a power of the DC offset signal.

The gain controller 490 can be an automatic gain controller (AGC) that includes a closed-loop feedback regulating circuit for maintaining a suitable gain for the operations of the modem 400 given the estimate of the power of the third digital signal. The gain indicated by the AGC controller is input to the DC offset look-up table 480 to determine the suitable digital representation of the DC offset signal. In comparison, a predefined initial gain, indicated by the gain index 472, (e.g., upon the first entry in the idle mode) or the last used gain (e.g., upon a switch from the packet detection mode) are input to the predefined DC look-up table 470 to determine the suitable digital representation of the predefined DC offset.

Of course, the modem 400 can include additional components that the analog-to-digital converter 410, the combiner 420, the filter 430, the power detector 440, the power comparator 450, the multiplexer 460, the predefined DC look-up table 470, the DC offset look-up table 480, and the gain controller 490. Upon detection that communications data is being received rather than noise, the additional components can process the relevant signal (e.g., the third digital signal) to generate and output data packets. These components include, for instance, a demodulator, an error correction decoder, a differential decoder, a descrambler, and/or a de-multiplexer. Such components are generally powered off in the idle mode and powered on in the packet detection mode.

Figure 5:
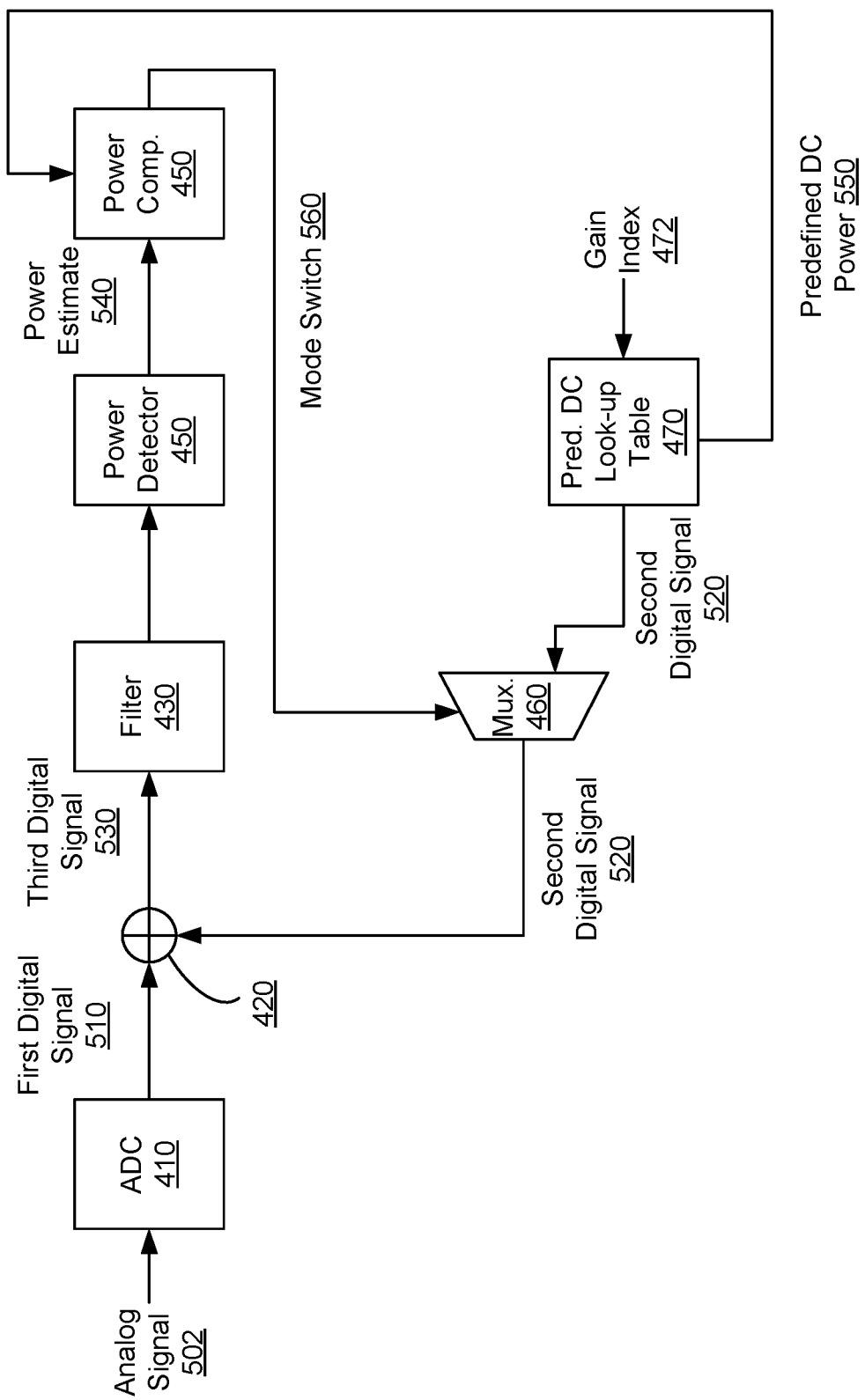
FIG. 5 illustrates an example of signal processing by a modem of a receiver in an idle mode, according to embodiments of the present disclosure.

FIG. 5 illustrates an example of signal processing by the modem 400 in the idle mode, according to embodiments of the present disclosure. As illustrated, in the idle mode, the signal processing involves the analog-to-digital converter 410, the combiner 420, the filter 430, the power detector 440, the power comparator 450, the multiplexer 460, the predefined DC look-up table 470 but not the DC offset look-up table 480 and the gain controller 490.

As illustrated, an analog signal 502 is input to the analog-to-digital converter 410. This analog signal 502 can be noise or can carry communications data. In turn, the analog-to-digital converter 410 outputs a first digital signal 510 that represents the analog signal 502 (e.g., multiple bit samples of particular resolutions depending on measured samples of the analog signal 502, such as 0111_1111_1111 when a 0.3 Volts sample is measured, 0010_0000_0000 when a 0.15 Volts is measured, 1000_0000_0000 when a −0.3 Volts sample is measured, and so on and so forth).

Given a gain index 472 of the modem 400, the predefined DC look-up table 470 indicates a second digital signal 520, where the second digital signal 520 corresponds to a digital representation of an predefined DC signal. The predefined DC look-up table 470 also indicates an predefined DC power 550 of the predefined DC signal. For instance, the predefined DC look-up table 470 indicates that the second digital signal 520 is 0000_0000_0110, corresponding to a fifty millivolts predefined DC and used for a particular dB gain.

The multiplexer's 460 input line corresponds to the first input line. Hence, the multiplexer 460 outputs the second digital signal 520 to the combiner 420.

The combiner 420 adds the first digital signal 510 and the second digital signal 520 to generate a third digital signal 530. For instance, the third digital signal 530 is 0000_0000_0100 when the analog signal 502 is noise having a positive number digitally represented as 0000_0000_0010. The third digital signal 530 represents the analog signal 502 as updated by adding the predefined DC signal.

The filter 430 receives the third digital signal 530 and, as applicable, filters noise added by the analog-to-digital conversion and outputs the third digital signal 530, as filtered, to the power detector 440. In turn, the power detector 440 generates and outputs a power estimate 540 of the third digital signal 530.

The power comparator 450 adjusts a power threshold to include the predefined DC power 550. For instance, a predefined value of the power threshold is two hundred millivolts. The power comparator 450 increases the power threshold to two-hundred and fifty millivolts. Further, the power comparator 450 compares the power estimate 540 to the power threshold, as adjusted. Based on the comparison, the power comparator 450 sets a value of a mode switch output 560 provided as the input selector to the multiplexer 460. In particular, if the comparison indicates that the power estimate 540 is greater than the power threshold, the mode switch output 560 indicates that the modem 400 is to switch to the packet detection mode. Accordingly, the multiplexer 460 switches from the first input line to the second input line. However, if the comparison indicates that the power estimate 540 is smaller than or equal to the power threshold, the mode switch output 560 indicates that the modem 400 is to remain in the idle mode. Accordingly, the multiplexer 460 does not switch away from the first input line.

Figure 6:
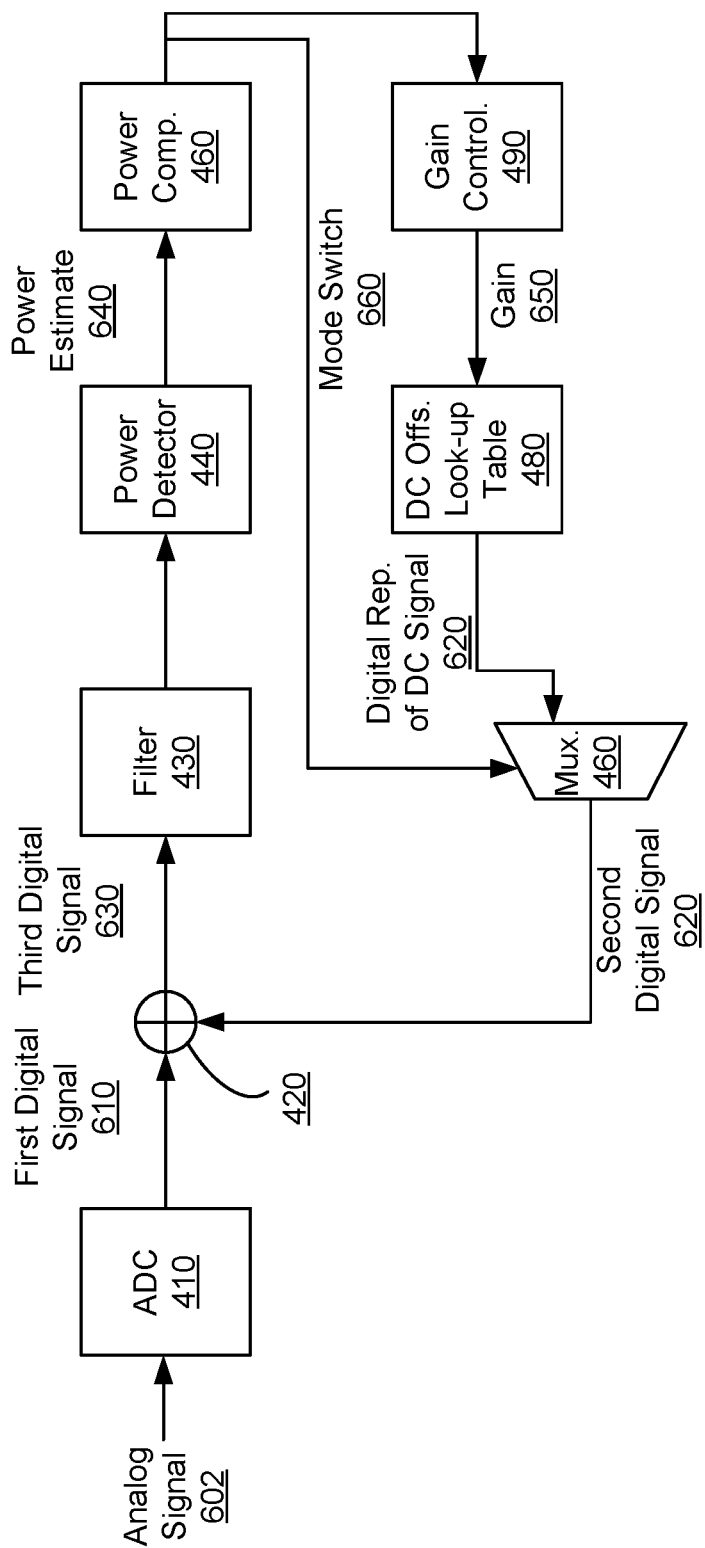
FIG. 6 illustrates an example of signal processing by a modem of a receiver in a packet detection mode, according to embodiments of the present disclosure.

FIG. 6 illustrates an example of signal processing by the modem 400 in the packet detection mode, according to embodiments of the present disclosure. As illustrated, in the packet detection mode, the signal processing involves the analog-to-digital converter 410, the combiner 420, the filter 430, the power detector 440, the power comparator 450, the multiplexer 460, the DC offset look-up table 480, the gain controller 490, but not the predefined DC look-up table 470.

In an example, an analog signal 602 is input to the analog-to-digital converter 410. This analog signal 502 can be noise or can carry communications data. In turn, the analog-to-digital converter 410 outputs a first digital signal 610 that represents the analog signal 602.

The gain controller 490 measures a suitable gain 650 for use in the packet detection mode. Given the gain 650, the DC offset look-up table 480 indicates a second digital signal 620, where the second digital signal 620 corresponds to a digital representation of a DC offset signal to remove from the analog signal 602. For instance, the predefined DC look-up table 470 indicates that the second digital signal 620 is 0000_0000_0010.

The multiplexer's 460 input line corresponds to the second input line. Hence, the multiplexer 460 outputs the second digital signal 620 to the combiner 420.

The combiner 420 adds the first digital signal 610 and the second digital signal 620 to generate a third digital signal 630. For instance, the third digital signal 630 is 0000_0000_0000 when the analog signal 602 is noise having a positive number digitally represented as 0000_0000_0010. The third digital signal 630 represents the analog signal 602 as compensated by removing the DC offset signal.

The filter 430 receives the third digital signal 630 and, as applicable, filters noise added by the analog-to-digital conversion and outputs the third digital signal 630, as filtered, to the power detector 440. In turn, the power detector 440 generates and outputs a power estimate 640 of the third digital signal 630.

The power comparator 450 does not adjust the power threshold and maintains it at the predefined value (e.g., two-hundred millivolts). The power comparator 450 compares the power estimate 640 to the power threshold. Based on the comparison, the power comparator 450 sets a value of a mode switch output 660 provided as the input selector to the multiplexer 460. In particular, if the comparison indicates that the power estimate 640 is greater than the power threshold, the mode switch output 660 indicates that the modem 400 is to remain in the packet detection mode. Accordingly, the multiplexer 460 does no switch away from the second input line. However, if the comparison indicates that the power estimate 640 is smaller than or equal to the power threshold, the mode switch output 560 indicates that the modem 400 is to switch to the idle mode. Accordingly, the multiplexer 460 switches from the second input line to the first input line.

FIG. 7 illustrates an example of a predefined DC look-up table 700 usable in an idle mode, according to embodiments of the present disclosure. The predefined DC look-up table 700 associates a predefined DC signal with a digital representation and a predefined value for DC power of the predefined DC signal. The predefined DC look-up table 700 also associates the predefined DC signal with a gain index. The predefined DC look-up table 700 is an example of the predefined DC look-up table 470 of FIG. 4.

The actual values of the predefined DC look-up table 700 depend on a number of factors, including the input range modem, the noise range, and the gain range associated with the modem that uses the predefined DC look-up table 700. In particular, during the design phase of the modem, the values are defined according to these factors. For instance, the largest voltage value of the predefined DC signal cannot be outside of the noise range. Further, the gain index for this largest value corresponds to the largest receiver gain. In addition, the digital representations are set such that fluctuations (e.g., changes between zeros and ones in the bits) are minimized when noise fluctuates around a common mode volt. Once defined, the values can be stored in the predefined DC look-up table 700 via a software load. The values shown in FIG. 7 are provided for illustrative purposes only.

As illustrated in FIG. 7, the predefined DC look-up table 700 stores three values for the predefined DC signal: one at twenty-five millivolts, one at thirty-five millivolts, and one at fifty millivolts. Each of these values is stored in association with a digital signal (e.g., by using a digital representation of ones and zeros), a value for a DC power, and a gain index. The twenty-five millivolts DC signal is associated with a digital signal of 1010_0000_0000 and a DC power of 12.5 milliwatts (assuming 0.5 amperes) and is usable with for a gain index of one. In comparison, the thirty-five millivolts DC signal is associated with a digital signal of 0000_0101_0000 and a DC power of 17.5 milliwatts (assuming 0.5 amperes) and is usable with for a gain index of two, whereas the fifty millivolts DC signal is associated with a digital signal of 0000_0000_00110 and a DC power of twenty-five milliwatts (assuming 0.5 amperes) and is usable with for a gain index of three.

In operation, and given a certain gain index (e.g., gain index three), the modem uses the gain index to look-up the predefined DC look-up table 700 and determine the digital signal and predefined DC power to use (e.g., 0000_0000_00110 and twenty-five milliwatts). The modem can also determine the voltage of the predefined DC signal (e.g., fifty millivolts).

Figure 8:
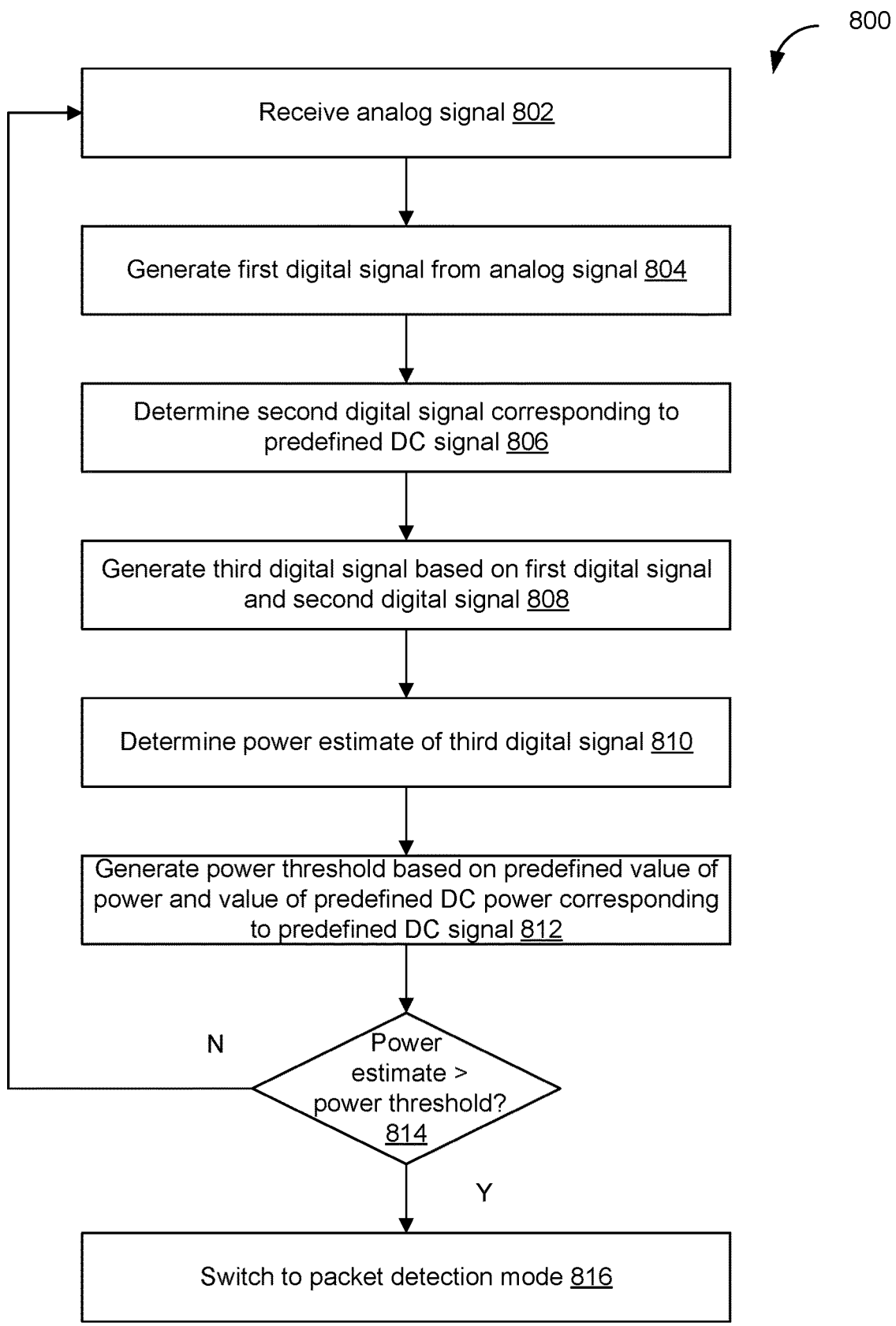
FIG. 8 illustrates an example of a flow for detecting whether a data packet is received, according to embodiments of the present disclosure.
Figure 9:
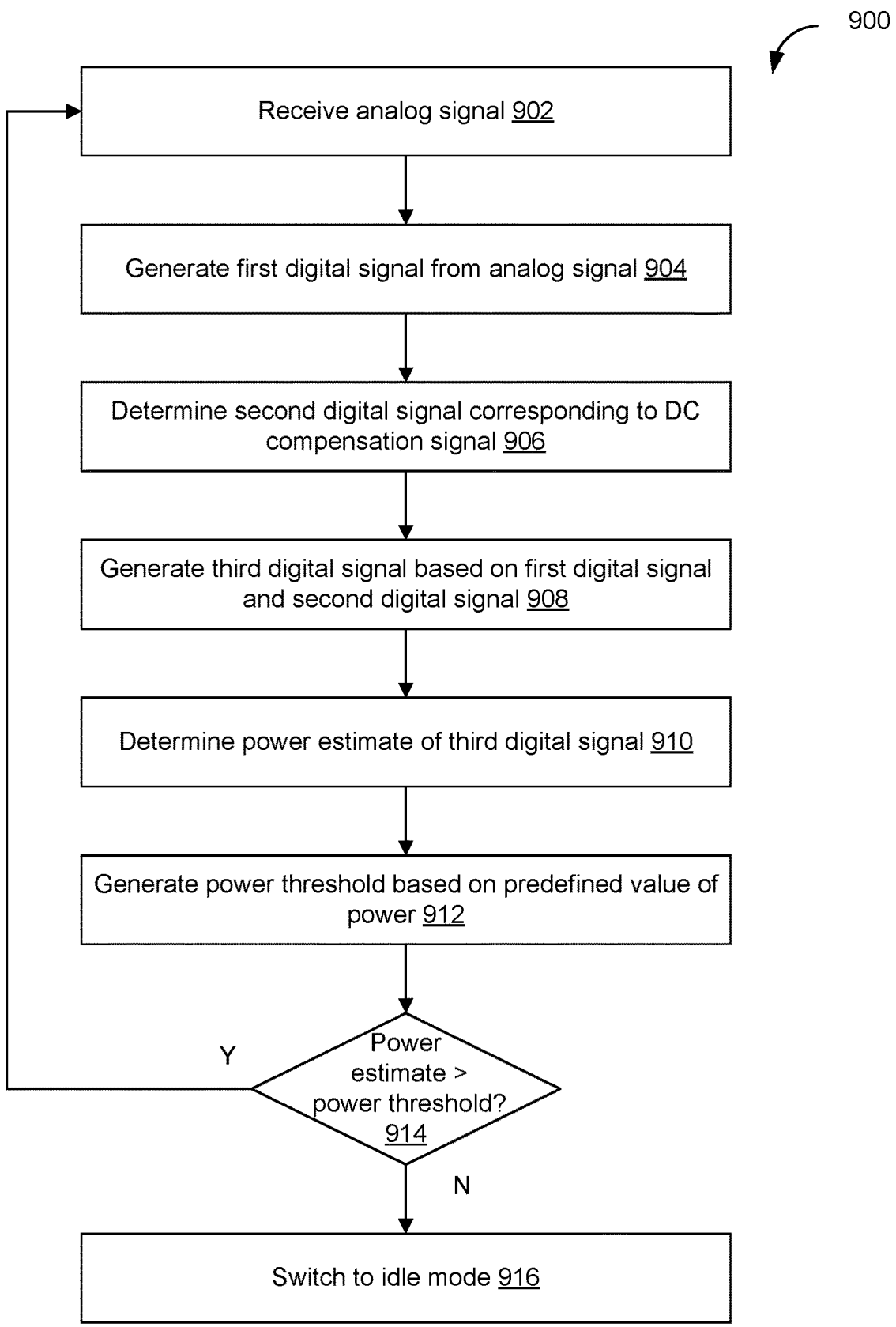
FIG. 9 illustrates an example of a flow for detecting whether noise is received, according to embodiments of the present disclosure.

FIGS. 8-9 illustrate examples of flows for reducing power consumption of a receiver in association with packet detection, according to embodiments of the present disclosure. The receiver can be any of the receivers described herein above in connection with FIGS. 1-6 and include a modem. Instructions for performing the operations of the flows can be implemented as specialized hardware, computer-readable instructions stored on an executed on specialized hardware, and/or on computer-readable instructions stored in non-transitory computer-readable media of a general purpose processor. While the operations are illustrated in a particular order, it should be understood that no particular order is necessary and that one or more operations may be omitted, skipped, and/or reordered.

FIG. 8 illustrates an example of a flow 800 for detecting whether a data packet is received, according to embodiments of the present disclosure. The receiver is in an idle mode. If a data packet is being received, the receiver switches to a packet detection mode. Otherwise, the receiver stays in the idle mode because noise is being received instead of the data packet.

In an example, the example flow 800 includes operation 802, where the receiver receives an analog signal. For instance, the analog signal is an IF input to the modem and corresponds to either a received signal that carries communication data or to a noise signal.

In an example, the example flow 800 includes operation 804, where the receiver generates a first digital signal from the analog signal. For instance, an analog-to-digital converter of the modem generates the first digital signal as a digital representation of the analog signal. The digital representation has a particular bit resolution (e.g., twelve bits) and is generated at a particular sample rate. The analog-to-digital converter sends the first digital signal to a combiner of the modem.

In an example, the example flow 800 includes operation 806, where the receiver determines a second digital signal that corresponds to an predefined DC signal. For instance, an predefined DC look-up table of the modem indicates the digital representation of the predefined DC signal given a gain of the receiver. The digital representation has the same bit resolution (e.g., twelve bits). The digital representation is output to a multiplexer the modem as the second digital signal and the multiplexer sends the digital representation to the combiner of the modem.

In an example, the example flow 800 includes operation 808, where the receiver generates a third digital signal based on the first digital signal and the second digital signal. For instance, the combiner of the modem adds the first digital signal and the second digital signal by using a digital adder to generate the third digital signal. The third digital signal has a digital representation of the same bit resolution (e.g., twelve bits) and represents an update of the analog signal to include the predefined DC signal in the digital domain.

In an example, the example flow 800 includes operation 810, where the receiver determines a power estimate of the third signal. For instance, a power estimator of the modem receives the third digital signal as a sample (e.g., a twelve bit sample). The power estimator estimates the amount of power from the digital representation of the sample and, as applicable, from other samples of similarly generated and received third digital signals (e.g., from multiple twelve bit samples). In addition and prior to the power estimation, a filter of the modem may remove noise from the samples, where the noise is due to the analog-to-digital conversion.

In an example, the example flow 800 includes operation 812, where the receiver generates a power threshold based on a predefined amount of power and on an predefined value for DC power that corresponds to the predefined DC signal. For instance, the power threshold is predefined to a particular predefined power value (e.g., one corresponding to two-hundred millivolts). The predefined DC look-up table indicates the value for the DC power (e.g., one corresponding to fifty millivolts) to a power comparator of the modem. The power comparator changes the power threshold by adding the value to the predefined power value (e.g., changes the power threshold to correspond to two-hundred and fifty millivolts).

In an example, the example flow 800 includes operation 814, where the receiver determines whether the power estimate of the third digital signal exceeds the power threshold. For instance, the power comparator receives the power estimate from the power estimator and compares the power estimate to the power threshold. If the power estimate exceeds the power threshold (e.g., an outcome of the comparing indicates that a value of the power estimate is larger than a value of the power threshold), operation 816 follows operation 814. Otherwise, operation 802 follows operation 814 as indicated by the loop back in FIG. 8, whereby the receiver remains in the idle mode.

In an example, the example flow 800 includes operation 816, where the receiver switches to the packet detection mode. For instance, an output of the power comparator indicates the result of the comparison of the power estimate to the power threshold. This output is an input selector to the multiplexer of the modem. Given the value of the input selector, the multiplexer switches its input line from a first line corresponding to the predefined DC look-up table to a second line corresponding to a DC offset look-up table of the modem. Other components of the modem that were previously powered off are powered on. These components can include any of a demodulator, an error correction decoder, a differential decoder, a descrambler, and/or a de-multiplexer. Different inputs to the demodulator are possible. For instance, the first digital signal is updated by removing a DC offset signal from the analog signal and the resulting digital signal is input to the demodulator. Alternatively, the second digital signal is removed from the third digital signal (e.g., by using the digital adder). Further, the resulting digital signal is updated by removing a DC offset signal to thereby be provided as input to the demodulator.

FIG. 9 illustrates an example of a flow 900 for detecting whether noise is received, according to embodiments of the present disclosure. The receiver is in the packet detection mode. If a data packet is no longer being received, the receiver switches to the idle mode. Otherwise, the receiver stays in the idle packet detection mode.

In an example, the example flow 900 includes operation 902, where the receiver receives an analog signal. For instance, the analog signal is an IF input to the modem and corresponds to either a received signal that carries communication data or to a noise signal.

In an example, the example flow 900 includes operation 904, where the receiver generates a first digital signal from the analog signal. For instance, the analog-to-digital converter of the modem generates the first digital signal as a digital representation of the analog signal. The digital representation has a particular bit resolution (e.g., twelve bits) and is generated at a particular sample rate. The analog-to-digital converter sends the first digital signal to the combiner of the modem.

In an example, the example flow 900 includes operation 906, where the receiver determines a second digital signal that corresponds to a DC compensation signal. For instance, the DC offset look-up table of the modem indicates the digital representation of the DC compensation signal given a gain of the receiver. The gain can be set by an automatic gain controller of the modem. The digital representation has the same bit resolution (e.g., twelve bits). The digital representation is output to the multiplexer the modem as the second digital signal and the multiplexer sends the digital representation to the combiner of the modem.

In an example, the example flow 900 includes operation 908, where the receiver generates a third digital signal based on the first digital signal and the second digital signal. For instance, the combiner of the modem adds the first digital signal and the second digital signal by using a digital adder to generate the third digital signal. The third digital signal has a digital representation of the same bit resolution (e.g., twelve bits) and represents a compensation of the analog signal to remove the DC offset signal in the digital domain.

In an example, the example flow 900 includes operation 910, where the receiver determines a power estimate of the third signal. For instance, a power estimator of the modem receives the third digital signal as a sample (e.g., a twelve bit sample). The power estimator estimates the amount of power from the digital representation of the sample and, as applicable, from other samples of similarly generated and received third digital signals (e.g., from multiple twelve bit samples). In addition and prior to the power estimation, the filter of the modem may remove noise from the samples, where the noise is due to the analog-to-digital conversion.

In an example, the example flow 900 includes operation 912, where the receiver generates a power threshold based on a value for predefined DC power that corresponds to the predefined DC signal (e.g., an predefined DC power). For instance, the power threshold is predefined to a particular power value (e.g., one corresponding to two-hundred millivolts), where this value can be specified in the DC look-up table of the modem. If this power threshold was previously changed (e.g., in the idle mode), the power comparator can remove the value for the predefined DC power that was included in the power threshold.

In an example, the example flow 900 includes operation 914, where the receiver determines whether the power estimate of the third digital signal exceeds the power threshold. For instance, the power comparator receives the power estimate from the power estimator and compares the power estimate to the power threshold. If the power estimate is smaller than or equal to the power threshold (e.g., an outcome of the comparing indicates that a value of the power estimate is less than a value of the power threshold), operation 916 follows operation 914. Otherwise, operation 902 follows operation 914 as indicated by the loop back in FIG. 9, whereby the receiver remains in the packet detection mode. In this mode, components of the predefined DC updated modem that are used to output data packets are powered on. These components can include any of the demodulator, the error correction decoder, the differential decoder, the descrambler, and/or the de-multiplexer. In this case, the third digital signal is input to the demodulator. The powered on components of the modem can extract the values of the bits from the third digital signal to output a data packet.

In an example, the example flow 900 includes operation 916, where the receiver switches to the packet detection mode. For instance, an output of the power comparator indicates the result of the comparison of the power estimate to the power threshold. This output is an input selector to the multiplexer of the modem. Given the value of the input selector, the multiplexer switches its input line from the second line corresponding to the DC offset look-up table to the first line corresponding to the predefined DC look-up table. In addition, the components of the modem that are used to extract data packets can be powered off, including any of the demodulator, the error correction decoder, the differential decoder, the descrambler, and/or the de-multiplexer.

Figure 10:
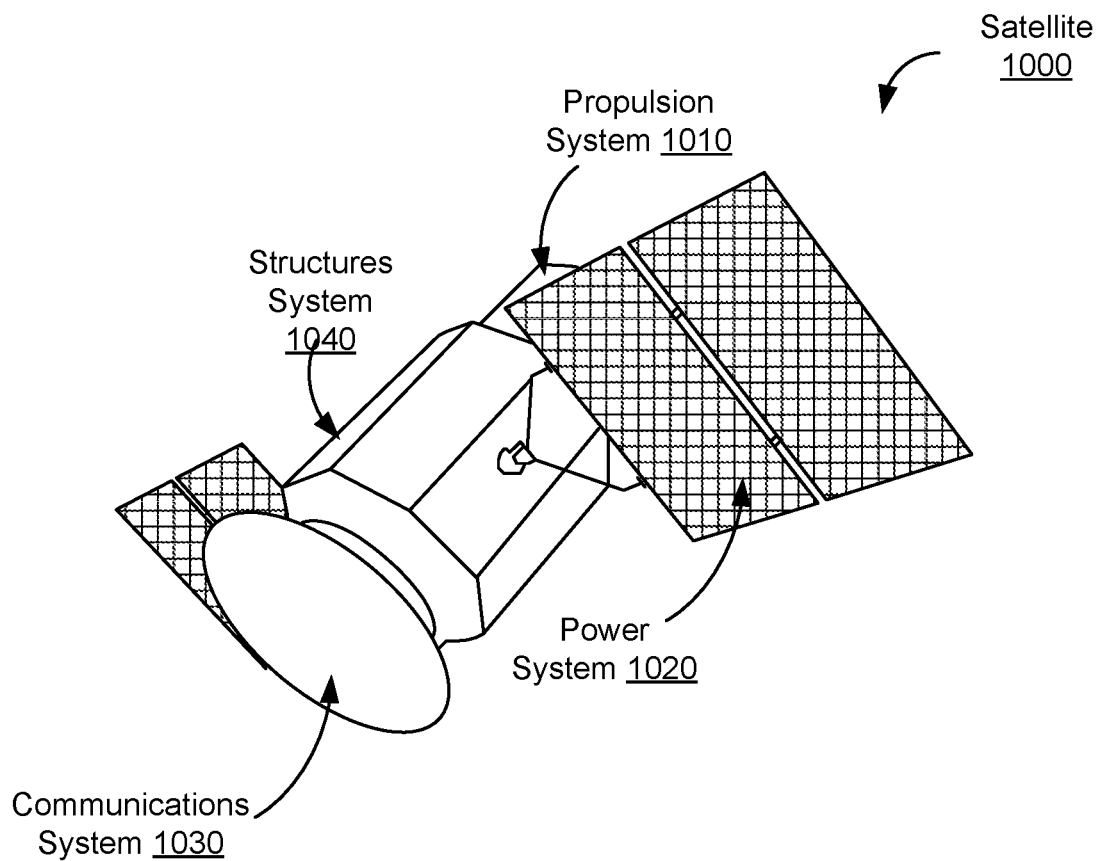
FIG. 10 illustrates an example of components of a satellite, according to embodiments of the present disclosure.

FIG. 10 illustrates an example of components of a satellite 1000, according to embodiments of the present disclosure. The satellite 1000 is an example of the satellite 110 of FIG. 1. As illustrated, the satellite 1000 includes, among other components, a propulsion system 1010, a power system 1020, a communications system 1030, and a structures system 1040.

In an example, the propulsion system 1010 includes one or more motors (e.g., rocket motors) that may move the satellite 1000 in a position within an orbit. The propulsion system 1010 also includes as thrusters to maintain the satellite 1000 in its position. The thrusters can also be used to move the satellite 1000 back into position in the orbit due to, for instance, solar wind or gravitational or magnetic forces.

In an example, the power system 1020 generates electricity from the solar panels deployed on the outside of the satellite 1000. The solar panels also store electricity in a set of storage batteries installed within the structures system 1040. The set of storage batteries can provide power at times when the panels do not receive rays from the sun. The power is used to operate various systems of the satellite 1000, including the communications system 1030.

In an example, the communications system 1030 handles receive and transmit functions. The communications system 1030 receives signals from a source, amplifies them, and transmits them to a destination. The source can be user equipment on the Earth or another satellite. The destination is typically different from the source and includes user equipment on the Earth or another satellite.

In an example, the structures system 1040 provides a stable set of structures so that the satellite 1000 can be kept in position. The structures system 1040 can also house components of other systems, such as subsystems of the power system 1020 (e.g., the storage batteries, power converters, and the like) and subsystems of the communications system 1030 (e.g., receivers, transmitters, and the like). Other components can also be housed within the structures system 1040. For instance, a thermal control system is contained in the structures system 1040. The thermal control system keeps components of the satellite 1000 within their operational temperature ranges. A control system is also contained in the structures system 1040. The control system orients the satellite 1000 precisely to maintain the proper position. When the satellite gets out of position, the control system instructs the propulsion system 1010 to control one or more thrusters to move the satellite 1000 back in position. The control system also includes tracking, telemetry, and control subsystems for monitoring vital operating parameters of the satellite 1000, telemetry circuits for relaying this information to user equipment on the Earth, a system for receiving and interpreting commands sent to the satellite 1000 from the user equipment or another satellite, and a command system for controlling the operation of the satellite 1000.

Figure 11:
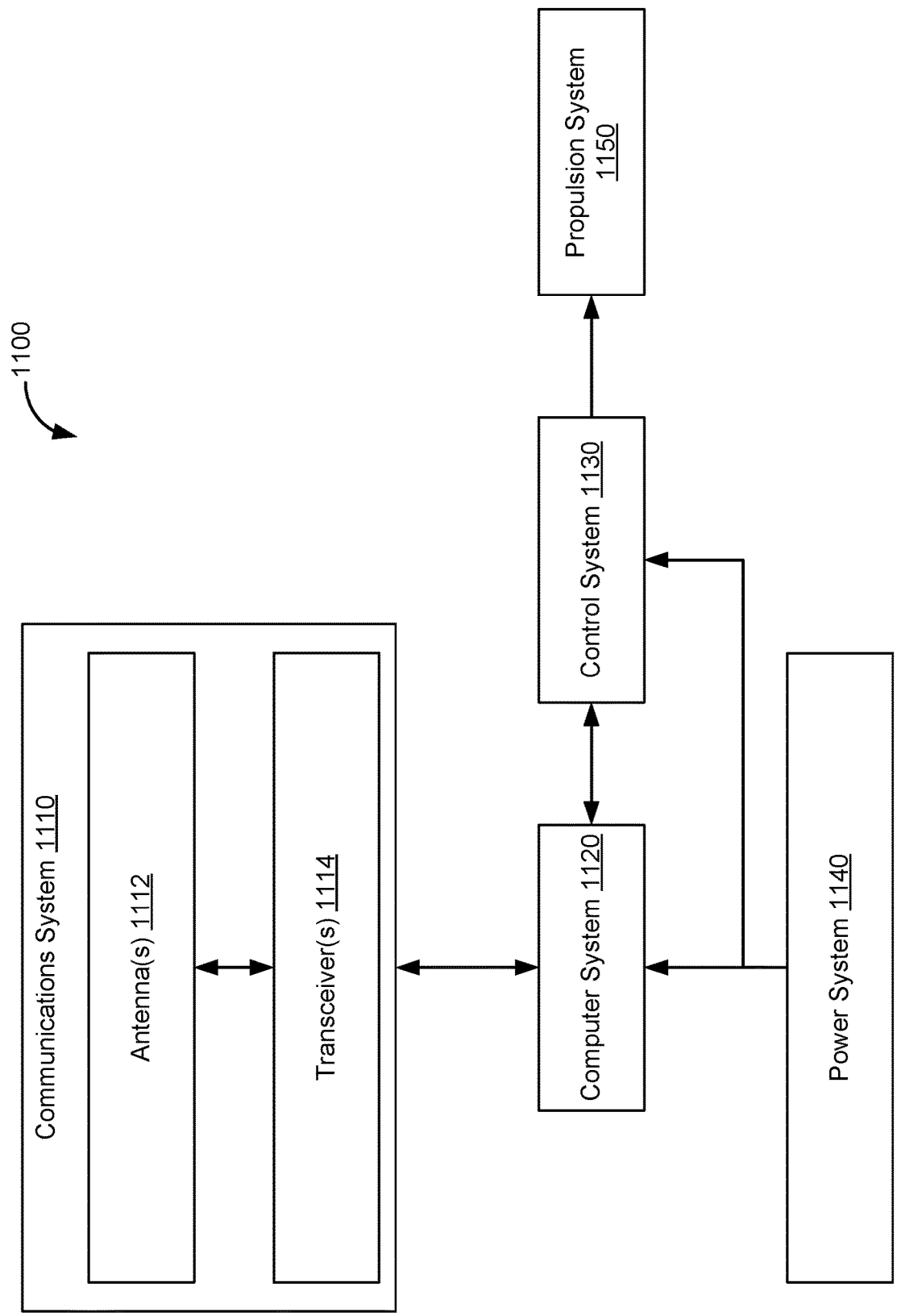
FIG. 11 illustrates an example of components of systems of a satellite, according to embodiments of the present disclosure.

FIG. 11 illustrates an example of components of systems 1100 of a satellite, according to embodiments of the present disclosure. The satellite can be any of the satellites described herein above in connection with FIGS. 1-9. As illustrated, the systems 1100 include a communications system 1110, a computer system 1120, a control system 1130, a power system 1140, and a propulsion system 1150.

In an example, the communications system 1110 provides communications with other satellites and/or user equipment such as ground stations. The communications system 1110 can include a set of antennas 1112 and a set of transceivers 1114. The set of antennas 1112 supports radio frequencies within a desired frequency spectrum and can be a phased area of antenna elements. The transceivers 1114 can be components of a transponder of the satellite and can include a set of satellite receivers and a set of satellite transmitters. The satellite transmitter(s) may, for example, multiplex, encode, and compress data to be transmitted, then modulate the data to a desired radio frequency and amplify it for transmission over the set of antennas 1112. Multiple channels can be used, in addition to error correction coding. The satellite receiver(s) demodulates received signals and performs any necessary de-multiplexing, decoding, decompressing, error correction and formatting of the signals from set of antennas 1112, for use by the computer system 1120. The set of antennas 1112 and/or the set of transceivers 1114 may also include switches, filters, low-noise amplifiers, down converters (for example, to an intermediate frequency and/or baseband), and/or other communications components. Data decoded by the satellite receiver(s) can be output to the computer system 1120 for further processing. Conversely, an output of the computer system 1120 can be provided to the satellite transmitter(s) for transmission.

The computer system 1120 can be communicatively coupled with the communications system 1110, the control system 1130, and the power system 1140. In an example, the computer system 1120 provides controls over and/or receives and processes data of the communications system 1110, the control system 1130, and the power system 1140. For instance, the computer system can process communications data of the communications system 1110, outputs attitude and position information to the control system 1130, and outputs power distribution controls to the power system 1140.

In an example, the control system 1130 maintains the satellite in a proper position within an orbit by instructing the propulsion system 1150 to control thrusters and orient the satellite precisely to maintain the proper position. Maintaining the orbit may also include maintaining the desired nodal separations between itself and the other satellites within the satellite constellation. For instance, the control system 1130 includes tracking, telemetry, and processors for calculating and/or receiving attitude and/or orbit adjustment information.

The power system 1140 provides electrical power to other ones of the systems 1100 including the communications system 1110, the computer system 1120, the control system 1130, and the propulsion system 1150. The power system 1140 may, for example, include one or more solar panels and a supporting structure, and one or more batteries. Telemetry circuits and processors of the power system 1140 can monitor the power collection and the power consumption and can control the collection and the distribution of the electrical power to the other ones of the systems 1100.

The propulsion system 1150 may include a set of motors and set of thrusters. The propulsion system 1150 may also include a set of fuel sources, such as fuel and oxidant tanks, battery cells, liquid fuel rocket, and/or an ion-thruster system. Telemetry circuits and processors of the propulsion system 1150 can control operations of the motors, thrusters, and/or fuel sources to move and orient the satellite.

In an example, the computer system 1120 (and, similarly, the remaining ones of the systems 1100) includes at least a processor, a memory, a storage device, communication peripherals, and an interface bus. The interface bus is configured to communicate, transmit, and transfer data, controls, and commands among the various components of the computer system 1120. The memory and the storage device include computer-readable storage media, such as RAM, ROM, electrically erasable programmable read-only memory (EEPROM), hard drives, CD-ROMs, optical storage devices, magnetic storage devices, electronic non-volatile computer storage, for example Flash® memory, and other tangible storage media. Any of such computer readable storage media can be configured to store instructions or program codes embodying aspects of the disclosure. The memory and the storage device also include computer readable signal media. A computer readable signal medium includes a propagated data signal with computer readable program code embodied therein. Such a propagated signal takes any of a variety of forms including, but not limited to, electromagnetic, optical, or any combination thereof. A computer readable signal medium includes any computer readable medium that is not a computer readable storage medium and that can communicate, propagate, or transport a program for use in connection with the computer system 1120.

Further, the memory includes an operating system, programs, and applications. The processor is configured to execute the stored instructions and includes, for example, a logical processing unit, a microprocessor, a digital signal processor, and other processors. The communication peripherals are configured to facilitate communication between the computer system 1120 and remaining ones of the systems 1100 and include, for example, a communications bus and/or a network interface controller, modem, wireless and wired interface cards, antenna, and other communication peripherals.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multipurpose microprocessor-based computer systems accessing stored software that programs or configures the portable device from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another, or may be combined in various ways. All possible combinations and sub-combinations are intended to fall within the scope of the present disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

What is claimed is:

1. A satellite receiver comprising:
   a modem storing computer-readable instructions that, upon execution on the modem, configure the modem to:
   receive, while in an idle mode, an analog signal;
   generate a first digital signal from the analog signal;
   determine, from a look-up table and based on a gain of the modem, a second digital signal corresponding to a predefined direct current (DC) signal, the look-up table storing the second digital signal in association with an index of the gain and with a value for DC power of the predefined DC signal;
   generate a power threshold by adding the value for DC power to a predefined power value;
   generate a third digital signal by adding the second digital signal to the first digital signal;
   estimate an amount of power of the third digital signal based on samples demodulated from the third digital signal;
   determine that the amount of power exceeds the power threshold;
   determine that the analog signal corresponds to a data packet; and
   switch from the idle mode to a packet detection mode.

2. The satellite receiver of claim 1, wherein the modem stores further computer-readable instructions that, upon execution on the modem, configure the modem to additionally:
   receive, while in the packet detection mode, a second analog signal;
   generate a fourth digital signal from the second analog signal;
   estimate a second amount of power of the fourth digital signal;
   determine that the second amount of power is smaller than the predefined power value;
   determine that the second analog signal corresponds to noise; and
   switch from the packet detection mode to the idle mode.

3. The satellite receiver of claim 1, wherein the modem stores further computer-readable instructions that, upon execution on the modem, configure the modem to additionally:
   decode, while in the packet detection mode, the data packet based at least in part on the first digital signal;
   receive, while in the packet detection mode, a second analog signal;
   generate a fourth digital signal from the second analog signal;
   estimate a second amount of power of the fourth digital signal;
   determine that the second amount of power is larger than the predefined power value; and
   decode, while in the packet detection mode, a second data packet based at least in part on the fourth digital signal.

4. A method implemented by a communications device, the method comprising:
   generating a first digital signal based at least in part on an analog signal;
   determining a second digital signal that corresponds to a predefined direct current (DC) signal;
   generating a third digital signal based at least in part on the first digital signal and the second digital signal;
   comparing a power estimate of the third digital signal with a power threshold, the power threshold defined based at least in part on the predefined DC signal; and
   determining that the analog signal corresponds to a data packet based at least in part on an outcome of the comparing.

5. The method of claim 4, wherein determining the second digital signal comprises:
   determining a receiver gain of the communications device; and
   determining the second digital signal from a look-up table based at least in part on the receiver gain, wherein the look-up table associates the second digital signal with the receiver gain.

6. The method of claim 4, further comprising:
   determining the second digital signal from a look-up table, wherein the look-up table associates the second digital signal with a value for DC power of the predefined DC signal; and
   generating the power threshold by adding the value to a predefined power value.

7. The method of claim 6, wherein the look-up table is associated with an idle mode of the communications device, and further comprising:
   switching to a packet detection mode of the communications device based at least in part on the determination that the analog signal corresponds to the data packet;
   receiving, while in the packet detection mode, a second analog signal;
   generating a fourth digital signal based at least in part on the second analog signal;
   determining that a power estimate of the fourth digital signal is less than the predefined power value; and
   switching from the packet detection mode to the idle mode.

8. The method of claim 4, further comprising:
switching from an idle mode of the communications device to a packet detection mode of the communications device based at least in part on the determination that the analog signal corresponds to the data packet; and
decoding, while in the packet detection mode, the data packet based at least in part on the first digital signal.

9. The method of claim 8, further comprising:
receiving, while in the packet detection mode, a second analog signal;
generating a fourth digital signal based at least in part on the second analog signal;
comparing a power estimate of the fourth digital signal with a second power threshold;
determining that a value of the power estimate exceeds a value of the second power threshold; and
decoding another data packet based at least in part on the fourth digital signal.

10. The method of claim 4, wherein the first digital signal is generated while the communications device is in an idle mode, and further comprising:
determining the second digital signal from a first look-up table associated with the idle mode, wherein the first look-up table associates the second digital signal with a value for DC power of the predefined DC signal;
generating the power threshold by adding the value to a predefined power value;
switching from the idle mode to a packet detection mode based at least in part on the determination that the analog signal corresponds to the data packet;
receiving, while in the packet detection mode, a second analog signal;
generating a fourth digital signal based at least in part on the second analog signal;
comparing a power estimate of the fourth digital signal to the predefined power value;
determining that a value of the power estimate is less than the predefined power value; and
switching to the idle mode.

11. The method of claim 4, further comprising:
generating, while in a packet detection mode of the communications device, a fourth digital signal based at least in part on a second analog signal;
comparing a power estimate of the fourth digital signal with a second power threshold; and
switching from the packet detection mode to an idle mode based at least in part on a determination that a value of the power estimate is smaller than the a value of the second power threshold.

12. A communications device comprising:
a modem storing computer-readable instructions that, upon execution on the modem, configure the modem to:
generate a first digital signal based at least in part on an analog signal;
determine a second digital signal that corresponds to a predefined direct current (DC) signal;
generate a third digital signal based at least in part on the first digital signal and the second digital signal;
compare a power estimate of the third digital signal with a power threshold, the power threshold defined based at least in part on the predefined DC signal; and
determine that the analog signal corresponds to a data packet based at least in part on an outcome of the comparing.

13. The communications device of claim 12, wherein the third digital signal changes between a first digital representation corresponding to a positive number and a second digital representation corresponding to a negative number, and wherein a predefined number of bits remain unchanged between the first digital representation and the second digital representation based at least in part on the predefined DC signal.

14. The communications device of claim 12, wherein the modem comprises a power comparator and a multiplexer, wherein the outcome of the comparing is an output from the power comparator and is an input selector to the multiplexer.

15. The communications device of claim 14, wherein a first input line to the multiplexer corresponds to a first look-up table associated with an idle mode of the communications device, wherein a second input line to the multiplexer corresponds to a second look-up table associated with a packet detection mode of the communications device, and wherein a switch between the first input line and the second input line is based at least in part on the input selector.

16. The communications device of claim 15, wherein an output of the multiplexer comprises the second digital signal based at least in part on an association in the first look-up table of the second digital signal with the predefined DC signal.

17. The communications device of claim 15, wherein the first look-up table associates the second digital signal with a value for DC power of the predefined DC signal, and wherein an amount of power is input to the power comparator.

18. The communications device of claim 12, wherein the modem stores additional computer-readable instructions that, upon execution on the modem, configure the modem to further:
determine the second digital signal based at least in part on a look-up table associated with an idle mode of the communications device, wherein the look-up table associates the second digital signal with the predefined DC signal, and
wherein the third digital signal is generated by adding a digital representation of the second digital signal to a digital representation of the first digital signal.

19. The communications device of claim 18, wherein the modem stores further computer-readable instructions that, upon execution on the modem, configure the modem to additionally:
determine a value for DC power of the predefined DC signal based at least in part on an association in the look-up table of the second digital signal with the value; and
generate the power threshold based at least in part on the value.

20. The communications device of claim 18, wherein the modem stores further computer-readable instructions that, upon execution on the modem, configure the modem to additionally:
generate a fourth digital signal based at least in part on a second analog signal;
generate a second power estimate of the fourth digital signal;

determine that the second power estimate exceeds a second power threshold, wherein the second power threshold is predefined based at least in part on a packet detection mode of the communications device; and decode a second data packet based at least in part on the determination that the second power estimate exceeds the second power threshold.

\* \* \* \* \*